(12) United States Patent
Lober et al.

(10) Patent No.: US 6,492,202 B1
(45) Date of Patent: Dec. 10, 2002

(54) METHOD OF ASSEMBLING COMPONENTS ONTO A CIRCUIT BOARD

(75) Inventors: David Lober, Chandler, AZ (US); Jay H. Barnes, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/473,303

(22) Filed: Dec. 28, 1999

(51) Int. Cl.$^7$ ................................................ H01L 21/52
(52) U.S. Cl. ................................................ 438/122
(58) Field of Search .................. 438/122, 128, 438/FOR 381; 257/678, 707, 719

(56) References Cited

U.S. PATENT DOCUMENTS

| | | | | |
|---|---|---|---|---|
| 5,894,882 A | * | 4/1999 | Kikuchi et al. | 165/185 |
| 6,069,023 A | * | 5/2000 | Bernier et al. | 438/107 |
| 6,075,700 A | * | 6/2000 | Houghton et al. | 165/80.2 |
| 6,271,058 B1 | * | 8/2000 | Yoshida | 438/108 |
| 6,114,190 A | * | 9/2000 | Brand | 438/122 |
| 6,143,590 A | * | 11/2000 | Ohki et al. | 438/122 |
| 6,180,436 B1 | * | 1/2001 | Koors et al. | 438/117 |
| 6,190,945 B1 | * | 2/2001 | Akram | 438/122 |
| 6,353,537 B2 | * | 3/2002 | Egawa | 165/185 |

* cited by examiner

Primary Examiner—George Fourson
Assistant Examiner—Foong SukSan
(74) Attorney, Agent, or Firm—S. Kevin Pickens; Kevin D. Wills

(57) ABSTRACT

An electronic component includes a semiconductor device (320) over a circuit board (210, 910), a heat sink (240, 940) over the semiconductor device, a clip (250, 950) over the heat sink and coupling the heat sink to anchors (230, 930) adjacent to the semiconductor device. A method of assembling the electronic component includes using an automated tool to couple the anchors to the circuit board, reflowing solder to electrically couple the semiconductor device and the anchors to a ground plane in the circuit board, and removably coupling the heat sink to the anchors.

10 Claims, 5 Drawing Sheets

METHOD OF ASSEMBLING COMPONENTS ONTO A CIRCUIT BOARD

FIELD OF THE INVENTION

This invention relates, in general, to electronics, and more particularly, to methods of assembling components onto a circuit board and electronic components thereof.

BACKGROUND OF THE INVENTION

In the electronics industry, many different types of components, including semiconductor devices and heat sinks, are assembled or mounted onto circuit boards to create electronic components. Some semiconductor devices require discrete, external heat sinks to efficiently dissipate heat from the semiconductor devices. These heat sinks are mounted onto the circuit board over the semiconductor devices.

Ball Grid Array (BGA) devices and Quad Flat Pack (QFP) devices are two examples of semiconductor devices that mount directly onto the circuit boards. Some of the BGA and QFP devices do not entirely encapsulate the semiconductor chip of the device. Instead, the back side of the semiconductor chip is exposed to more efficiently dissipate heat from the semiconductor chip. However, these exposed-die BGA and QFP devices are not compatible with the discrete, external heat sinks.

Furthermore, heat sink anchors are mounted onto the circuit board to couple the heat sinks to the circuit board. However, these anchors must be manually mounted onto the circuit board. Therefore, the anchors are not compatible with a high speed, high volume assembly process. Additionally, the heat sink anchors protrude through the circuit board and extend at least 0.25 centimeters beyond the back side of the circuit board. This large protrusion renders the resulting electronic component unusable in many applications having strict height limitations on the back side of the circuit boards.

Moreover, as the semiconductor devices increase in speed, the semiconductor devices radiate higher frequency emissions. Industry regulations require these high frequency emissions to be shielded from adjacent electronic components.

Accordingly, a need exists for a method of assembling components onto a circuit board and an electronic component thereof where the heat sink of the electronic component is compatible with exposed-die semiconductor devices, where the heat sink anchors are compatible with a high speed, high volume assembly process, where the heat sink anchors do not violate the height limitations of certain applications, and where the radiated high frequency emissions from the semiconductor devices are shielded from neighboring components.

BRIEF DESCRIPTION OF THE DRAWINGS

The present invention will be better understood from a reading of the following detailed description, taken in conjunction with the accompanying drawing figures in which.

Figure 1:
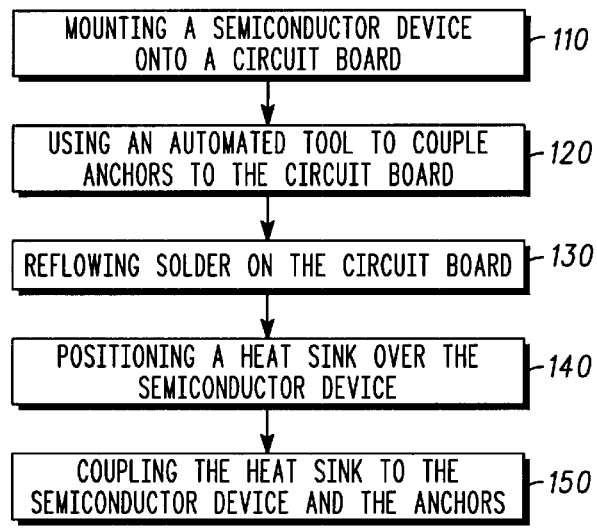
FIG. 1 outlines a method of assembling components onto a circuit board in accordance with an embodiment of the present invention.

For simplicity and clarity of illustration, the drawing figures illustrate the general manner of construction, and elements in the drawing figures are not necessarily drawn to scale. Additionally, the same reference numerals in different figures denote the same elements, and descriptions and details of well-known features and techniques are omitted to avoid unnecessarily obscuring the present invention. Furthermore, the terms front, back, over, under, and the like in the description and in the claims, if any, are used for descriptive purposes. However, it is understood that the embodiment of the invention described herein is capable of operation in other orientations than described or illustrated herein. It is further understood that the terms so used are for the purposes of describing relative positions and are interchangeable under appropriate circumstances.

DETAILED DESCRIPTION OF THE DRAWINGS

FIG. 1 outlines a method 100 of assembling components onto a circuit board. At a step 110, a semiconductor device is mounted onto or coupled to a circuit board. The term "coupled" as used herein is defined as directly or indirectly connected in a mechanical or non-mechanical manner. In the preferred embodiment, the semiconductor device in step 110 includes a partially exposed semiconductor chip, as explained in more detail hereinafter. Also in the preferred embodiment, the circuit board includes metal tracings, a ground plane, and a plurality of holes with a configuration to receive anchors in predetermined orientations, as also explained in more detail hereinafter.

At a step 120, an automated tool is used to mount or couple anchors to the circuit board. In the preferred embodiment, the automated tool is a pick-and-place tool having a vacuum tip to pick up, move, align, and place the anchors around a perimeter of the semiconductor device. Also in the preferred embodiment, the anchors are attached to the circuit board in the aforementioned predetermined orientation, as explained in more detail hereinafter.

At a step 130, solder is reflowed on the circuit board to electrically couple the semiconductor device and the anchors to the metal tracings on the circuit board. In the preferred embodiment, step 130 reflows the solder to simultaneously electrically couple the semiconductor device and the anchors to the metal tracings. Next, at a step 140, a heat sink is positioned over the semiconductor device and the circuit board. Then, at a step 150, the heat sink is coupled to the semiconductor device and the anchors. In the preferred embodiment, the heat sink is coupled to the partially exposed semiconductor chip, and the heat sink is removable from the anchors. Also, the heat sink is preferably grounded to the ground plane on the circuit board through the anchors. The ground of the heat sink shields the semiconductor device from electromagnetic interference and shields adjacent devices from high frequency emissions radiated from the semiconductor device.

Figure 2:
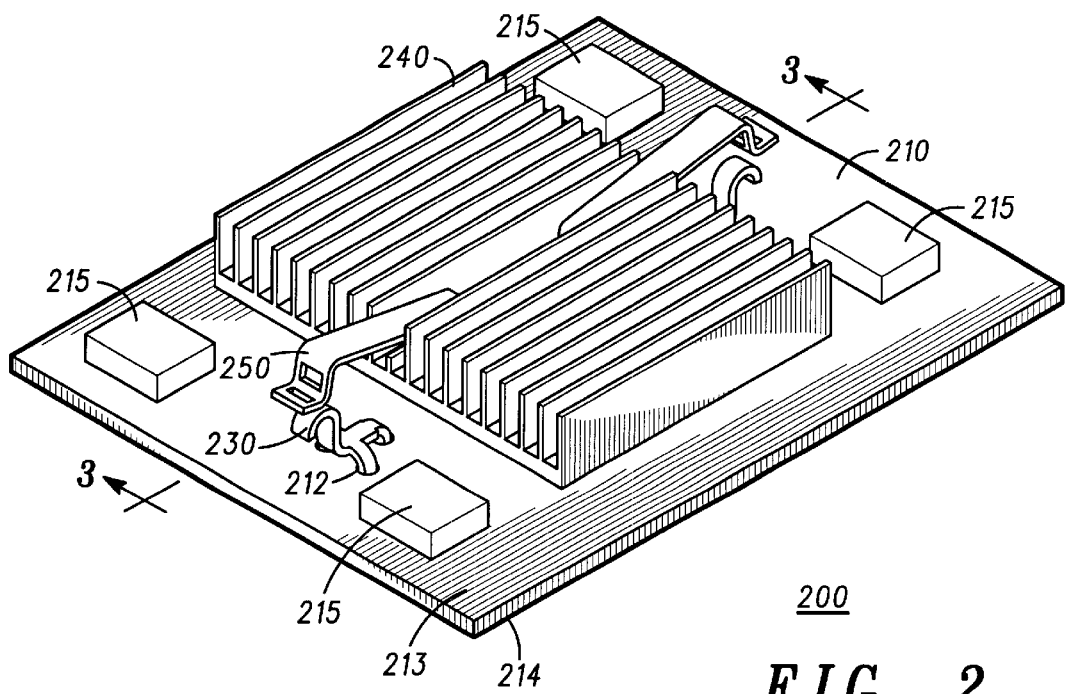
FIG. 2 illustrates an isometric view of an electronic component during the assembly method of FIG. 1 in accordance with an embodiment of the present invention.
Figure 3:
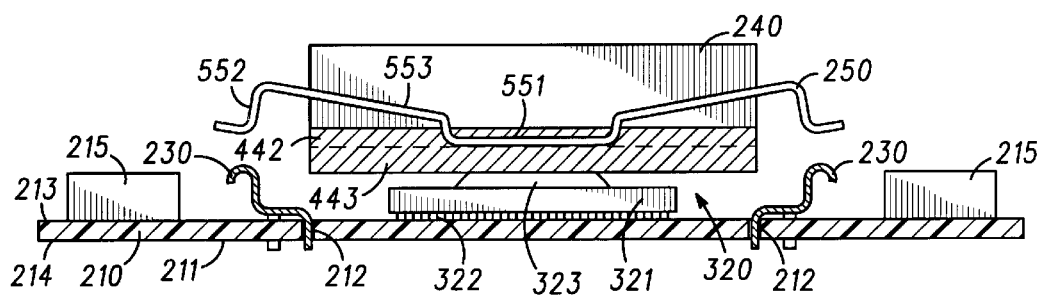
FIG. 3 illustrates a cross-sectional view of the electronic component of FIG. 2 taken along a section line 3—3 in FIG. 2.

FIG. 2 illustrates an isometric view of an embodiment of electronic component 200 after positioning the heat sink in step 140 of FIG. 1, and FIG. 3 illustrates a cross-sectional view of component 200 taken along a section line 3—3 in FIG. 2. Component 200 includes a circuit board 210 having a first surface 213 and a second surface 214 opposite surface 213. Component 200 further includes a plurality of devices 215 and 320 (FIG. 3), a plurality of anchors 230, a heat sink 240, and a heat sink clip 250, all of which are located over surface 213 of circuit board 210.

Devices 215 are illustrated in highly simplified form and can have surface mount and/or through-hole configurations. Some of devices 215 can be discrete devices such as, for example, resistors, capacitors, inductors, and/or power transistors. Others of devices 215 can be, for example, integrated circuits.

Circuit board 210 includes a plurality of metal tracings (not illustrated in FIGS. 2 or 3) to electrically couple together devices 215 and 320 (FIG. 3). The particular pattern or configuration of the metal tracings will depend on, among other features, the particular devices used for devices 215 and 320 and the functionality of component 200. The metal tracings are preferably located at surfaces 213 and 214 of circuit board 210. At least a portion of the metal tracings at surface 214 preferably form a ground plane 211 (FIG. 3) for component 200.

Circuit board 210 further includes a plurality of holes, including holes 212. At least some of the holes are used to electrically couple the metal tracings at surface 213 to the metal tracings at surface 214, and vice versa. Furthermore, at least some of the holes are also used to attach devices 215 to circuit board 210 when devices 215 are through-hole devices. Holes 212 are configured to receive anchors 212, and the metal tracings in holes 212 are coupled to ground plane 211, as explained in more detail hereinafter.

As explained earlier, device 320 (FIG. 3) is located over and is coupled to surface 213 of circuit board 210. In the preferred embodiment, device 320 is a surface mount semiconductor device such as a BGA package having a partially exposed semiconductor chip. For example, device 320 includes a semiconductor chip 323 (FIG. 3) mounted over a ceramic substrate 321 (FIG. 3). The term "semiconductor chip" as used herein is defined to include a semiconductor substrate, a plurality of semiconductor transistors, an interconnect system, a plurality of dielectric layers, and a passivation layer. Device 320 further includes a plurality of electrically conductive elements 322 (FIG. 3) coupled to substrate 321. In the illustrated BGA embodiment, elements 322 represent a plurality of solder balls. In alternative embodiments, device 320 can be other types of surface mount semiconductor devices that include a Pin Grid Array (PGA) or a QFP package. In the PGA embodiment, elements 322 represent a plurality of electrically conductive pins, and in the QFP embodiment, elements 322 represent a plurality of electrically conductive surface mount leads. Regardless of the particular embodiment of device 320, semiconductor chip 323 has an exposed back surface facing away from circuit board 210.

Heat sink 240 is located over chip 323 of device 320 and surface 213 of circuit board 210. Heat sink 240 draws heat out of chip 323 and efficiently dissipates the heat from chip 323. Heat sink 240 is also preferably grounded to ground plane 211, as explained in more detail hereinafter.

Clip 250 is located over a portion of heat sink 240 and couples heat sink 240 to circuit board 210. As shown hereinafter, clip 250 is coupled to anchors 230 to attach heat sink 240 to circuit board 210. Anchors 230 are located around a periphery of heat sink 240 and device 320. Other aspects of anchors 230, heat sink 240, and clip 250 are explained hereinafter.

Figure 4:
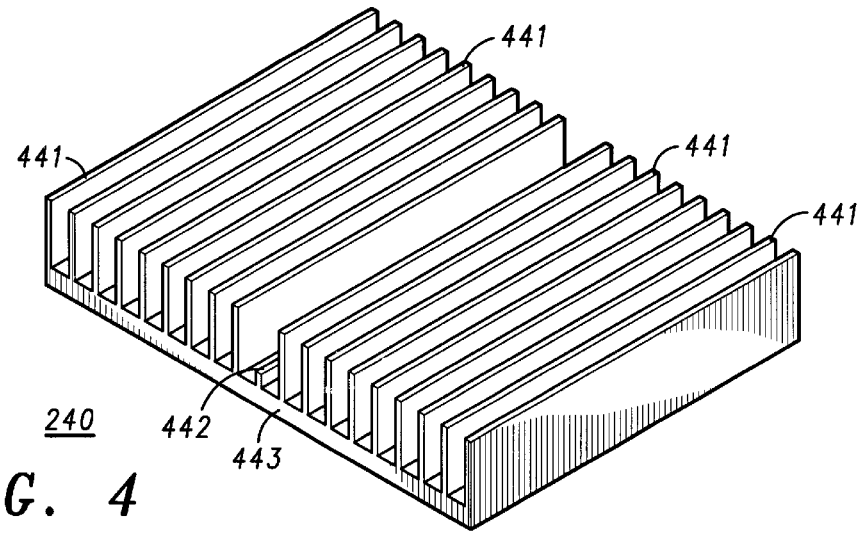
FIGS. 4, 5, and 6 illustrate isometric views of different portions of the electronic component of FIG. 2.
Figure 5:
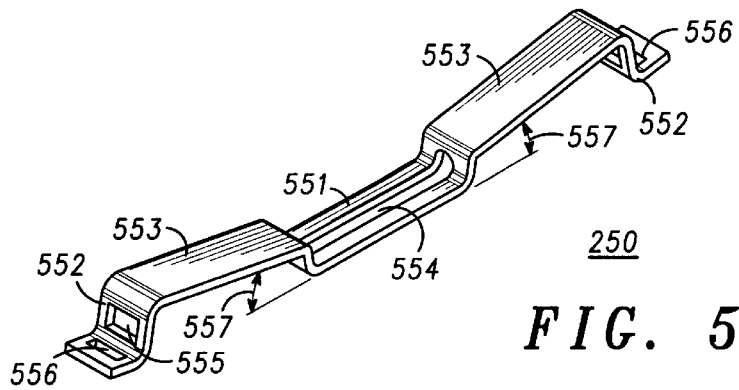
Figure 6:
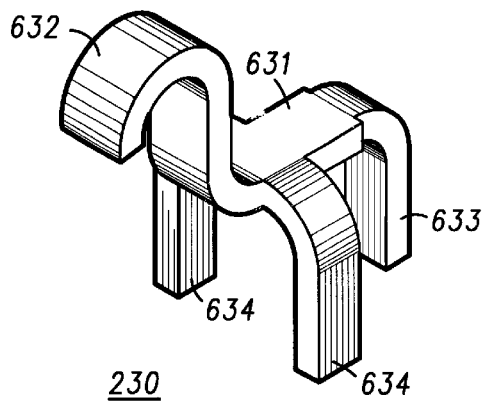

FIGS. 4, 5, and 6 illustrate isometric views of different portions of component 200. In particular, FIG. 4 illustrates an isometric view of heat sink 240. Heat sink 240 includes a substantially planar base 443. Heat sink 240 also includes a plurality of long fins 441 that are substantially parallel to each other, that extend substantially perpendicularly from base 443, and that are integral with base 443. Heat sink 240 further includes a single short fin 442 that is substantially parallel to fins 441, that extend substantially perpendicularly from base 443, and that is integral with base 443. In this preferred embodiment, heat sink 240 is comprised of a thermally and electrically conductive material, such as aluminum, and has an anodized outer coating.

FIG. 5 illustrates an isometric view of clip 250. Clip 250 includes an interface portion 551 located at a central region of clip 250, two latching portions 552 located at distal ends of clip 250, and two spring portions 553 located between interface portion 551 and latching portions 552. In the preferred embodiment, clip 250 is comprised of an electrically conductive material such as stainless steel, and has a thickness of approximately 0.5 to 1.0 millimeters and a width of approximately 5 to 10 millimeters. In this embodiment, spring portion 553 preferably has a length of approximately 15 to 25 millimeters and also preferably forms an angle 557 of approximately 10 to 20 degrees with interface portion 551. This particular configuration of clip 250 provides a suitable resiliency or tension of approximately 5 to 8 pounds of force to easily secure heat sink 240 (FIGS. 2, 3, 4) to circuit board 210 (FIGS. 2, 3).

Each of latching portions 552 includes an anchor coupling hole 555 through which anchor 230 (FIGS. 2, 3) is subsequently inserted, as explained hereinafter. Each of latching portions 552 includes an anchor release hole 556, which facilitates the removal of clip 250 from circuit board 210 (FIGS. 2, 3).

Interface portion 551 of clip 250 includes a heat sink hole 554. Viewing FIGS. 2, 3, 4, and 5 in combination, one skilled in the art will understand that interface portion 551 of clip 250 rests on or is supported by base 443 of heat sink 240. The length of interface portion 551 is smaller than the width of heat sink 240 (FIG. 3) to permit a reduction in the total length of clip 230, which reduces a combined footprint of heat sink 240, clip 250, and anchors 230 (FIGS. 2, 3) on circuit board 210 (FIGS. 2, 3). Furthermore, one skilled in the art will also understand that a portion of fin 442 of heat sink 240 is located in hole 554 of clip 250.

An example of a process used to permanently couple clip 250 to heat sink 240 includes orienting clip 250 to heat sink 240, inserting a portion of fin 442 of heat sink 240 through hole 554 of clip 250, and permanently deforming or peening the portion of fin 442 to break through the anodized coating of heat sink 240 to physically and electrically couple heat sink 240 to clip 250. Heat sinks used in the art have anodized coatings that impede an electrical connection with a heat sink dip. However, by peening fin 442 of heat sink 240, the anodized coating is broken, and an adequate and reliable electrical connection between clip 250 and heat sink 240 is formed.

FIG. 6 illustrates an isometric view of one of anchors 230. The anchor in FIG. 6 includes a flat portion 631 having a suitable size or area to permit a vacuum device in an automated tool to pick up the anchor from a tray or tape-and-reel, and move, align, and place the anchor onto circuit board 210 (FIGS. 2, 3). As an example, flat portion 631 can have a width of approximately 2.5 millimeters and a length of approximately 4 millimeters. The anchor further includes a heat sink coupling portion 632 extending upwards from flat portion 631. In the preferred embodiment, portion 632 has a shape of a hook or an upside down "J" having a full radius hook to avoid dislodging from clip 250 (FIGS. 2, 3, 5). Portion 632 is coupled to clip 250 (FIGS. 2, 3, 5), as explained in more detail hereinafter. The anchor further includes a stabilizing portion 633 extending downwards from flat portion 631. In the preferred embodiment, portion 633 is located at an opposite side of the anchor as portion 632 to stabilize or balance the anchor from the forces exerted on the anchor by clip 250 (FIGS. 2, 3, 5). The anchor additionally includes a plurality of circuit board coupling portions 634 extending downwards from flat portion 631. Portions 634 are used to couple the anchor to circuit board 210. In the preferred embodiment, each of portions 634 extend through circuit board 210 (FIG. 3) and protrude beyond surface 214 (FIG. 3) by less than approximately 0.1 centimeters to be compatible with height restrictions of embedded applications for component 200.

In the preferred embodiment, portions 633 and 634 of the anchor are legs extending downward from flat portion 631 and are inserted into holes 212 (FIGS. 2, 3) of circuit board 210 (FIGS. 2, 3). In this embodiment, the anchor is reliably coupled to ground plane 211 (FIG. 3) through holes 212, as explained in more detail hereinafter. In an alternative embodiment, portion 633 can be attached directly to portion 632 to stabilize the anchor, or portion 633 can be a heavy mass located anywhere on the anchor. Also in the preferred embodiment, each of anchors 230 is comprised of tin-plated steel to have a solderable surface.

Figure 8:
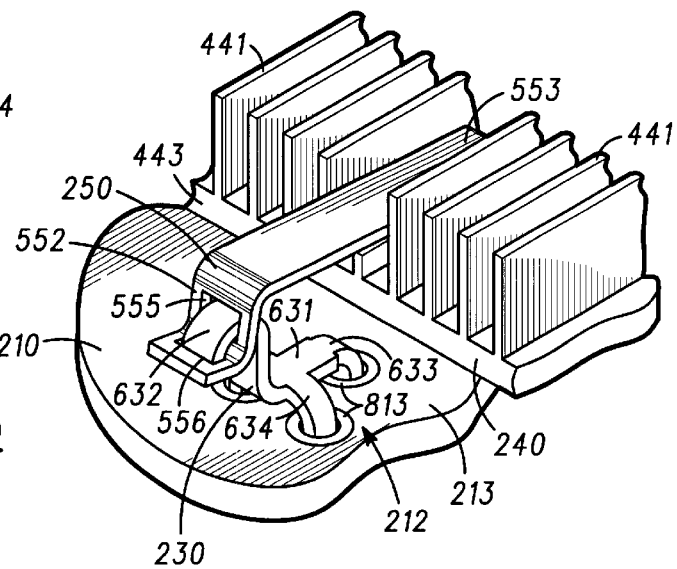
FIG. 8 illustrates an enlarged isometric view of a portion of the electronic component of FIG. 7.
Figure 7:
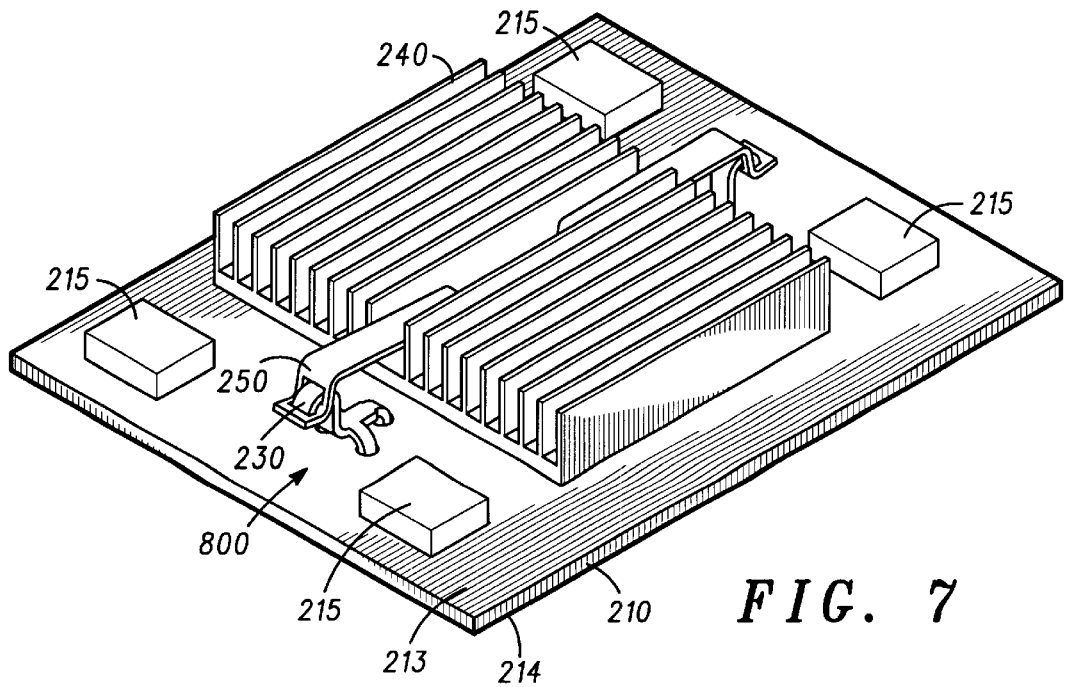
FIG. 7 illustrates an isometric view of the electronic component of FIG. 2 after the assembly method of FIG. 1.

FIG. 7 illustrates an isometric view of component 200 after coupling the heat sink to the circuit board in step 150 of FIG. 1, and FIG. 8 illustrates an enlarged isometric view of a portion 800 of component 200. Viewing FIGS. 6 and 8 in combination, one skilled in the art will understand that holes 212 in circuit board 210 have a configuration to receive anchors 230 in a predetermined orientation. In particular, each set of holes 212 is configured to receive a single anchor in a single predetermined orientation, such that flat portion 631 of anchor 230 is substantially parallel to surface 213 of circuit board 210 and such that portion 632 of anchor 230 faces away from heat sink 240 and the device underlying heat sink 240. Furthermore, latching positions 552 of clip 250 are pushed or depressed downwards until portion 632 is inserted through hole 555 of clip 250 to attach or secure heat sink 240 to circuit board 210.

Metal tracings 813 are located around and in holes 212 to electrically couple anchors 230 to ground plane 211 (FIG. 3). In this embodiment, heat sink 240 is coupled to ground plane 211 of FIG. 3 via clip 250, anchor 230, and tracings 813. One skilled in the art will understand that solder will be located adjacent to portions 633 and 634 of anchor 230 and tracings 813; however, the solder is not shown in FIG. 8 to more clearly illustrate the inter-relationship between portions 813, holes 212, and anchor 230.

Clip 250 can be removed from anchor 230 by placing a rigid tool in hole 556 of clip 250 and prying portion 632 of anchor 230 out of hole 555 of clip 250. Accordingly, in the preferred embodiment, clip 250 is not permanently coupled to anchor 230, but is removably coupled to anchor 230. In this embodiment, heat sink 240 can be removed to service or replace the device underlying heat sink 240.

Figure 9:
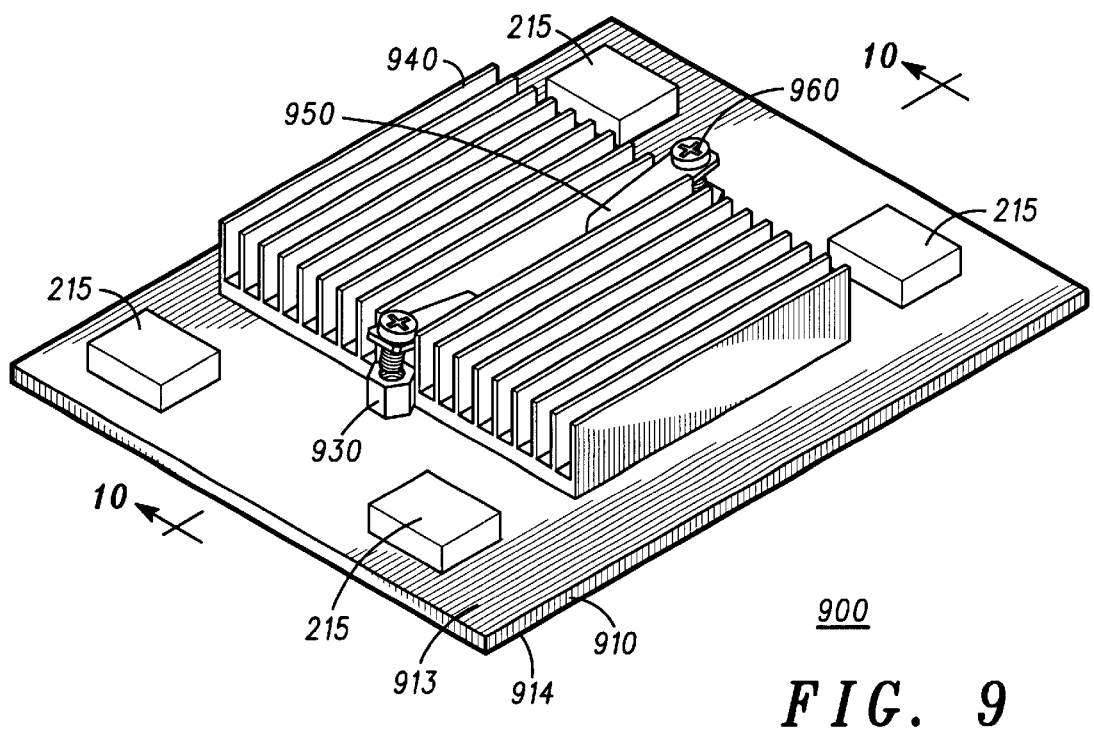
FIG. 9 illustrates an isometric view of a different electronic component in accordance with a different embodiment of the present invention.
Figure 10:
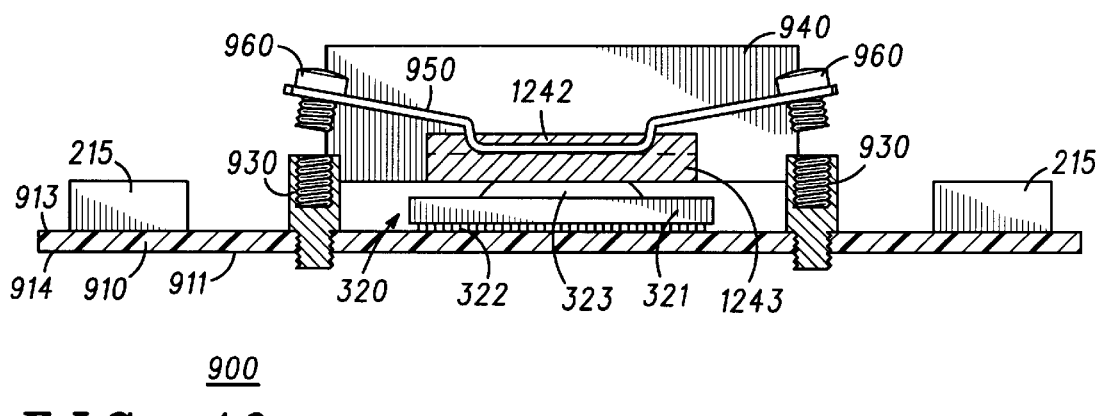
FIG. 10 illustrates a cross-sectional view of the electronic component of FIG. 9 taken along a section line 10—10 in FIG. 9.

FIG. 9 illustrates an isometric view of an electronic component 900, which is a different embodiment of component 200. FIG. 10 illustrates a cross-sectional view of component 900 taken along a section line 10—10 in FIG. 9. Component 900 includes a circuit board 910 having opposite surfaces 913 and 914. Circuit board 910 is similar to circuit board 210 in FIGS. 2, 3. For example, circuit board 910 in FIG. 10 includes a ground plane 911 formed by at least a portion of the metal traces at surface 914 of circuit board 910. Circuit board 910 is similar to circuit board 210 in FIG. 2. In addition to devices 215 and 320, component 900 also includes stand-offs or anchors 930, a heat sink 940, a clip 950, and screws 960. In the preferred embodiment, each of anchors 930 preferably extend through circuit board 910 and protrude beyond surface 914 by less than approximately 0.1 centimeters to comply with height requirements of embedded applications for component 900. Furthermore, similar to heat sink 240 of component 200, heat sink 940 of component 900 is preferably grounded to ground plane 911 to shield underlying device 320 from electromagnetic interference and to shield adjacent devices from the radiated high frequency emissions from device 320.

Figure 11:
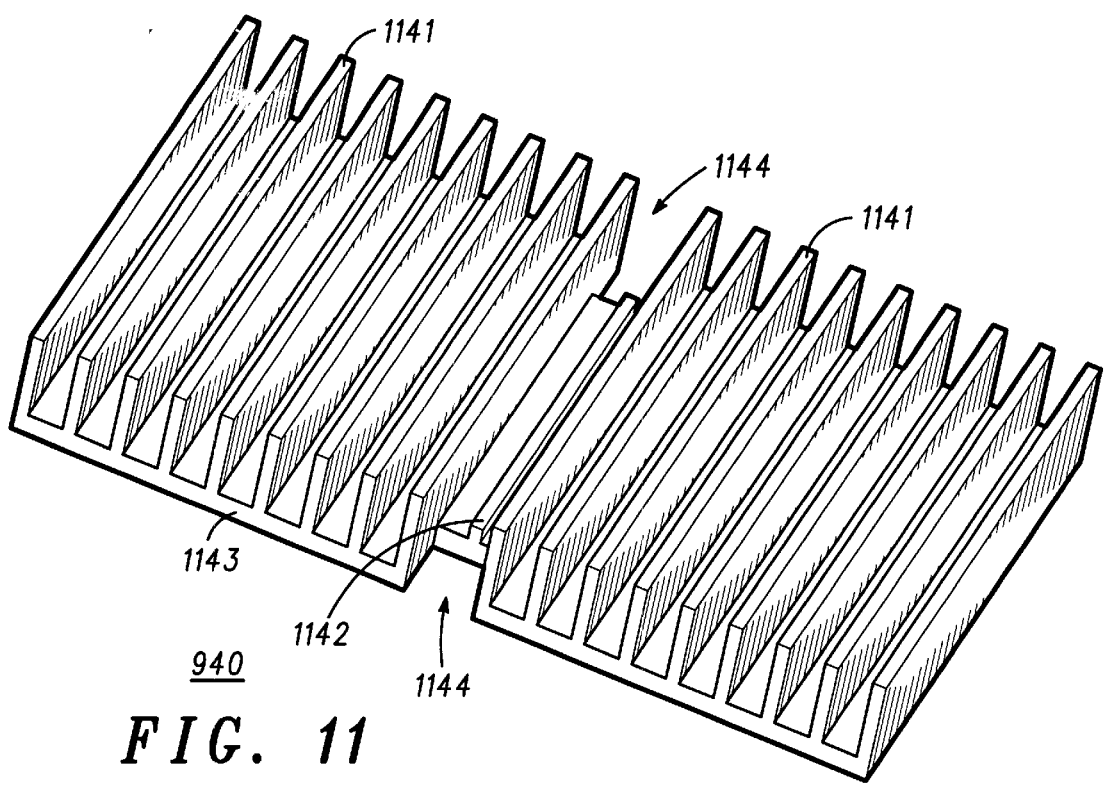
FIGS. 11, 12, and 13 illustrate isometric views of different portions of the electronic component of FIG. 9.
Figure 12:
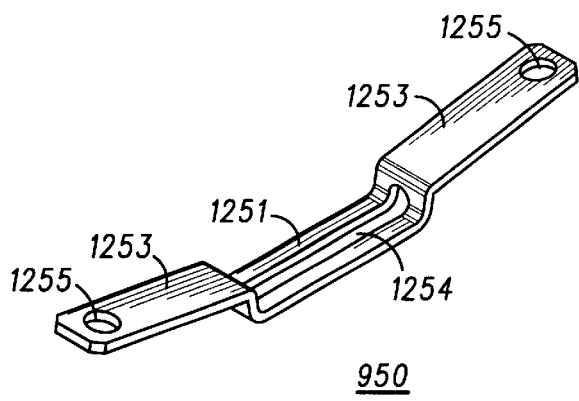
Figure 13:
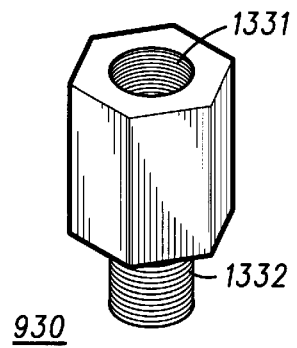

FIGS. 11, 12, and 13 illustrate isometric views of different portions of component 900. In particular, FIG. 11 illustrates a planar view of heat sink 940. Heat sink 940 is similar to heat sink 240 in FIGS. 2, 3, 4, 7, and 8. Heat sink 940 includes fins 1141, a fin 1142, and a base 1143, which are similar to fins 441, fin 442, and base 443, respectively, of heat sink 240. However, heat sink 940 also includes optional recesses or cut-outs 1144 located adjacent to fin 1142. Anchors 930 (FIGS. 9, 10) are located within cut-outs 1144 to reduce the combined footprint of heat sink 940, clip 950 (FIGS. 9, 10), and anchors 930 (FIGS. 9, 10) on circuit board 910 (FIGS. 9, 10).

FIG. 12 illustrates an isometric view of clip 950. Clip 950 includes an interface portion 1251 located between two spring portions 1253, which are similar to portions 551 and 553, respectively, of clip 250 in FIG. 5. Interface portion 1251 includes a heat sink hole 1254, which is similar to hole 554 of clip 250. A portion of fin 1142 of heat sink 940 (FIG. 11) is located within hole 1254 of clip 950. Clip 950 also includes a plurality of anchor coupling holes 1255, which are similar to holes 555 of clip 250. However, holes 1255 are located in spring portions 1253. In the preferred embodiment, clip 950 is electrically conductive to couple heat sink 940 (FIGS. 9, 10, 11) to ground plane 911 (FIG. 10).

FIG. 13 illustrates an isometric view of one of anchors 930. The anchor includes a hole 1331 in which one of screws 960 (FIGS. 9, 10) can be fastened. Anchors 930 also include threads 1332, which are swaged into holes in circuit board 910 (FIGS. 9, 10) to secure anchor 930 to circuit board 910. In the preferred embodiment, anchors 930 are electrically conductive to couple heat sink 940 (FIGS. 9, 10, 11) to ground plane 911 (FIG. 10).

Therefore, an improved method of assembling components onto a circuit board and component thereof is provided to overcome the disadvantages of the prior art. For example, the heat sink of the electronic component is compatible with exposed-die semiconductor devices, and the heat sink anchors are compatible with a high speed, high volume assembly process. Additionally, the heat sink anchors do not violate the height limitations of embedded applications, and the radiated high frequency emissions from the semiconductor device underlying the heat sink are shielded from neighboring components.

While the present invention has been particularly shown and described with reference to embodiments, it will be understood by those skilled in the art that various changes may be made to the embodiments herein without departing from the spirit or scope of the present invention. For instance, the numerous details set forth herein such as, for example, the material compositions and the dimensions are provided to facilitate the understanding of the present invention and are not provided to limit the scope of the present invention. Furthermore, heat sinks 240 and 940 can each include a plurality of short fins 442 and 1142, respectively, to be used with a single clip or a plurality of clips. Accordingly, the disclosure of embodiments of the present invention is intended to be illustrative of the scope of the present invention and is not intended to be limiting. It is intended that the scope of the present invention shall be limited only to the extent required by the appended claims.

What is claimed is:

1. A method of assembling components onto a circuit board comprising mounting a semiconductor device onto the circuit board;

using an automated tool to couple anchors to the circuit board and adjacent to the semiconductor device;

positioning a heat sink over the semicondutor device, wherein the heat sink has an anodized coating;

orientating a clip to the heat sink, wherein the clip defines a hole;

inserting a portion of the heat sink through the hole defined by the clip;

deforming the portion of the heat sink to break through the anodized coating to electrically couple the heat sink to the clip; and coupling the heat sink to the anchors, wherein coupling comprises using the clip to electrically couple the heat sink to the anchors.

2. The method of claim 1 comprising:

providing a ball grid array package having a partially exposed semiconductor chip for the semiconductor device;

facing the partially exposed semiconductor chip away from the circuit board; and locating the heat sink over the partially exposed semiconductor chip.

3. The method of claim 1 comprising:

providing a quad flat pack package having a partially exposed semiconductor chip for the semiconductor device;

facing the partially exposed semiconductor chip away from the circuit board; and locating the heat sink over the partially exposed semiconductor chip.

4. The method of claim 1 further comprising:

reflowing solder to electrically couple the semiconductor device and the anchors to the circuit board.

5. The method of claim 1 comprising:

providing the anchors with heat sink coupling portions; and positioning the anchors on the circuit board with the heat sink coupling portions facing away from the semiconductor device.

6. The method of claim 1 further comprising: grounding the heat sink to a ground plane on the circuit board.

7. The method of claim 6 wherein:

the grounding step comprises grounding the heat sink to the ground plane through the anchors.

8. A method of assembling components onto a circuit board comprising:

providing a semiconductor device with a partially exposed semiconductor chip;

mounting the semiconductor device onto the circuit board;

using an automated tool to attach anchors to the circuit board and adjacent to the semiconductor device;

reflowing solder to simultaneously electrically couple the semiconductor device and anchors to the circuit board;

providing a heat sink, wherein the heat sink has an anodized coating;

orientating a clip to the heat sink, wherein the clip defines a hole;

inserting a portion of the heat sink through the hole defined by the clip;

deforming the portion of the heat sink to break through the anodized coating to electrically couple the heat sink to the clip; and coupling the heat sink to the partially exposed semiconductor chip and the anchors, wherein coupling comprises using the clip to electrically couple the heat sink to the anchors.

9. The method of claim 8 comprising:

providing the anchors with coupling portions; and providing the circuit board with a ground plane, wherein the circuit board defines a plurality of holes with a configuration to receive the anchors in an orientation with the couple portions of the anchors facing away from the semiconductor device, wherein:

the using step comprises using the automated tool to insert the anchors into the plurality of holes in the circuit board, to couple the anchors to the ground plane, and to align anchors in the orientation; and the coupling step comprises coupling the heat sink to the coupling portions of the anchors.

10. The method of claim 9 comprising:

coupling the heat sink to the ground plane through the anchors.

\* \* \* \* \*